(12) United States Patent
Gudem et al.

(10) Patent No.: US 8,754,706 B2
(45) Date of Patent: Jun. 17, 2014

(54) POWER BASED FEEDBACK FOR IMPROVED POWER AMPLIFIER (PA) EFFICIENCY

(75) Inventors: Prasad Srinivasa Siva Gudem, San Diego, CA (US); Ketan Humnabadkar, San Diego, CA (US); Vijay K. Chellappa, San Diego, CA (US); Sumit Verma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 13/490,707

(22) Filed: Jun. 7, 2012

(65) Prior Publication Data

US 2013/0033314 A1 Feb. 7, 2013

Related U.S. Application Data

(60) Provisional application No. 61/514,262, filed on Aug. 2, 2011.

(51) Int. Cl.
*H03G 3/20* (2006.01)

(52) U.S. Cl.
USPC .......................................................... 330/127

(58) Field of Classification Search
USPC ................................ 330/127, 297; 455/127.1
See application file for complete search history.

(56) References Cited

U.S. PATENT DOCUMENTS

| | | | |
|---|---|---|---|
| 5,892,404 A | 4/1999 | Tang | |
| 6,043,707 A | 3/2000 | Budnik | |
| 6,141,541 A | 10/2000 | Midya et al. | |
| 6,191,653 B1 * | 2/2001 | Camp et al. | 330/129 |
| 6,531,860 B1 | 3/2003 | Zhou et al. | |
| 6,646,501 B1 | 11/2003 | Wessel | |
| 6,987,417 B2 | 1/2006 | Winter et al. | |
| 7,026,868 B2 | 4/2006 | Robinson et al. | |
| 7,183,856 B2 | 2/2007 | Miki et al. | |
| 7,333,563 B2 | 2/2008 | Chan et al. | |
| 7,346,122 B1 | 3/2008 | Cao | |
| 7,427,897 B2 | 9/2008 | Hau et al. | |
| 7,741,903 B2 | 6/2010 | Vinayak et al. | |
| 7,741,906 B1 | 6/2010 | Summerfield | |
| 7,830,220 B2 | 11/2010 | Ceylan et al. | |
| 8,093,946 B2 | 1/2012 | Wimpenny et al. | |

(Continued)

FOREIGN PATENT DOCUMENTS

WO    WO-0030250 A1    5/2000

OTHER PUBLICATIONS

Chung S. et al., "Asymmetric Multilevel Out phasing Architecture for Multi-Standard Transmitters", Radio Frequency Integrated Circuits Symposium, 2009. RFIC 2009. IEEE, IEEE, Piscataway, NJ, USA, Jun. 7, 2009, pp. 237-240, XP031480266, ISBN: 978-1-4244-3377-3.

(Continued)

*Primary Examiner* — Steven J Mottola
(74) *Attorney, Agent, or Firm* — Linda G. Gunderson (57) ABSTRACT

A power train amplification stage is described. The power train amplification stage includes a power amplifier. The power train amplification stage also includes a switched mode power supply that provides a bias voltage to the power amplifier. The power train amplification stage further includes a pulse density modulator. The power train amplification stage also includes a feedback path from the power amplifier to the pulse density modulator.

20 Claims, 10 Drawing Sheets

(56) References Cited

U.S. PATENT DOCUMENTS

| | | |
|---|---|---|
| 8,160,519 B2 | 4/2012 | Nentwig |
| 2008/0258831 A1 | 10/2008 | Kunihiro et al. |
| 2009/0054018 A1 | 2/2009 | Waheed et al. |
| 2010/0176885 A1 | 7/2010 | Kim et al. |
| 2011/0063026 A1 | 3/2011 | Jung et al. |
| 2011/0298539 A1 | 12/2011 | Drogi et al. |

OTHER PUBLICATIONS

Hammi, et al., "On the Robustness of Digital Predistortion Function Synthesis and Average Power Tracking for Highly Nonlinear Power Amplifiers," IEEE Transactions on Microwave Theory and Techniques, vol. 55, Issue 6, pp. 1382-1389, 2007.

Idris, et al., "Design and Implementation of Self-Calibration for Digital Predistortion of Power Amplifiers," WSEAS Transactions on Circuits and Systems, vol. 7, Issue 2, pp. 75-84, 2008.

International Search Report and Written Opinion—PCT/US2012/049403—ISA/EPO—Jan. 14, 2013.

Tenbroek, et al., "Single-Chip Tri-Band WCDMA/HSDPA Transceiver without External SAW Filters and with Integrated Tx Power Control," 2008 IEEE International Solid-State Circuits Conference (Paper).

Tenbroek, et al., "Single-Chip Tri-Band WCDMA/HSDPA Transceiver without External SAW Filters and with Integrated Tx Power Control," 2008 IEEE International Solid-State Circuits Conference (Powerpoint Presentation).

\* cited by examiner

POWER BASED FEEDBACK FOR IMPROVED POWER AMPLIFIER (PA) EFFICIENCY

CLAIM OF PRIORITY UNDER 35 U.S.C. §119

The present Application for Patent claims priority to Provisional Application No. 61/514,262, entitled "DEVICES AND METHODS FOR FEEDBACK-BASED POWER AMPLIFIER COLLECTOR VOLTAGE CONTROL" filed Aug. 2, 2011, and assigned to the assignee hereof and hereby expressly incorporated by reference herein.

TECHNICAL FIELD

The present disclosure relates generally to wireless devices for communication systems. More specifically, the present disclosure relates to systems and methods for power based feedback for improved power amplifier (PA) efficiency.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

These electronic devices may communicate wirelessly with each other and with a network. As the demand for information by these electronic devices has increased, the downlink throughput has also increased. One such way to increase downlink throughput is the use of carrier aggregation. In carrier aggregation, multiple carriers may be aggregated on the physical layer to provide the required bandwidth (and thus the required throughput).

It may be desirable for an electronic device to maximize battery life. Because an electronic device often runs on a battery with a limited operation time, reductions in the power consumption of an electronic device may increase the desirability and functionality of the electronic device.

SUMMARY

A power train amplification stage is described. The power train amplification stage includes a power amplifier, a switched mode power supply that provides a bias voltage to the power amplifier, a pulse density modulator and a feedback path from the power amplifier to the pulse density modulator.

The pulse density modulator may control the switched mode power supply. The pulse density modulator may receive a sigma-delta digital signal. The feedback path may include a power detector. Calibration tables for the power amplifier may be maintained in baseband memory. The power detector may be continuously monitored in online mode to keep updating the bias voltage for the power amplifier.

The power train amplification stage may use dynamic voltage scaling to reduce inefficiencies in the power amplifier. The inefficiencies may include at least one of a frequency change versus power amplifier output, a temperature change versus power amplifier output, a conservative collector bias versus adjacent channel leakage ratio inefficiencies and calibration inefficiencies. The feedback path may include a receive downconverter. The receive downconverter may include inphase/quadrature sampling. The power train amplification stage may be part of a transmitter in a wireless communication device or in a base station.

A method for adjusting a bias voltage to a power amplifier is also described. A transmit signal is obtained from a power amplifier. A feedback signal is obtained from the transmit signal. The feedback signal is provided to a pulse density modulator. An output of the pulse density modulator is used to control a switched mode power supply. A bias voltage applied to the power amplifier is adjusted using the switched mode power supply.

The method may be performed by a wireless communication device or a base station. The feedback signal may be obtained using a power detector. The power detector may be continuously monitored in online mode to keep updating the bias voltage for the power amplifier. The power detector may maintain calibration tables for the power amplifier. Maintaining calibration tables for the power amplifier may include transmitting using a gain control word to control a transceiver, incrementally adjusting the bias voltage to obtain a new bias voltage, estimating a new power amplifier output using a power estimation curve and updating the new bias voltage and the new power amplifier output in the calibration tables.

It may be determined that a mapping of the new power amplifier output and the new bias voltage is close to a characterized table. The method may include periodically checking that the new power amplifier output is accurate via the feedback signal. The feedback signal may be obtained using a receive downconverter. The receive downconverter may include inphase/quadrature sampling. The method may reduce inefficiencies in the power amplifier using dynamic voltage scaling. The inefficiencies may include at least one of a frequency change versus power amplifier output, a temperature change versus power amplifier output, a conservative collector bias versus adjacent channel leakage ratio inefficiencies and calibration inefficiencies.

An apparatus for adjusting a bias voltage to a power amplifier is described. The apparatus includes means for obtaining a transmit signal from a power amplifier. The apparatus also includes means for obtaining a feedback signal from the transmit signal. The apparatus further includes means for providing the feedback signal to a pulse density modulator. The apparatus also includes means for using an output of the pulse density modulator to control a switched mode power supply. The apparatus further includes means for adjusting a bias voltage applied to the power amplifier using the switched mode power supply.

A computer-program product for adjusting a bias voltage to a power amplifier is also described. The computer-program product includes a non-transitory computer-readable medium having instructions thereon. The instructions include code for causing a wireless device to obtain a transmit signal from a power amplifier. The instructions also include code for causing the wireless device to obtain a feedback signal from the transmit signal. The instructions further include code for causing the wireless device to provide the feedback signal to a pulse density modulator. The instructions also include code for causing the wireless device to use an output of the pulse density modulator to control a switched mode power supply. The instructions further include code for causing the wireless device to adjust a bias voltage applied to the power amplifier using the switched mode power supply.

DETAILED DESCRIPTION

The $3^{rd}$ Generation Partnership Project (3GPP) is a collaboration between groups of telecommunications associations that aims to define a globally applicable $3^{rd}$ generation (3G) mobile phone specification. 3GPP Long Term Evolution (LTE) is a 3GPP project aimed at improving the Universal Mobile Telecommunications System (UMTS) mobile phone standard. The 3GPP may define specifications for the next generation of mobile networks, mobile systems and mobile devices. In 3GPP LTE, a mobile station or device may be referred to as a "user equipment" (UE).

3GPP specifications are based on evolved Global System for Mobile Communications (GSM) specifications, which are generally known as the Universal Mobile Telecommunications System (UMTS). 3GPP standards are structured as releases. Discussion of 3GPP thus frequently refers to the functionality in one release or another. For example, Release 99 specifies the first UMTS third generation (3G) networks, incorporating a CDMA air interface. Release 6 integrates operation with wireless local area networks (LAN) networks and adds High Speed Uplink Packet Access (HSUPA). Release 8 introduces dual downlink carriers and Release 9 extends dual carrier operation to uplink for UMTS.

CDMA2000 is a family of $3^{rd}$ generation (3G) technology standards that use code division multiple access (CDMA) to send voice, data and signaling between wireless devices. CDMA2000 may include CDMA2000 1x, CDMA2000 EV-DO Rev. 0, CDMA2000 EV-DO Rev. A and CDMA2000 EV-DO Rev. B. 1x or 1xRTT refers to the core CDMA2000 wireless air interface standard. 1x more specifically refers to 1 times Radio Transmission Technology and indicates the same radio frequency (RF) bandwidth as used in IS-95. 1xRTT adds 64 additional traffic channels to the forward link. EV-DO refers to Evolution-Data Optimized. EV-DO is a telecommunications standard for the wireless transmission of data through radio signals.

Figure 1:
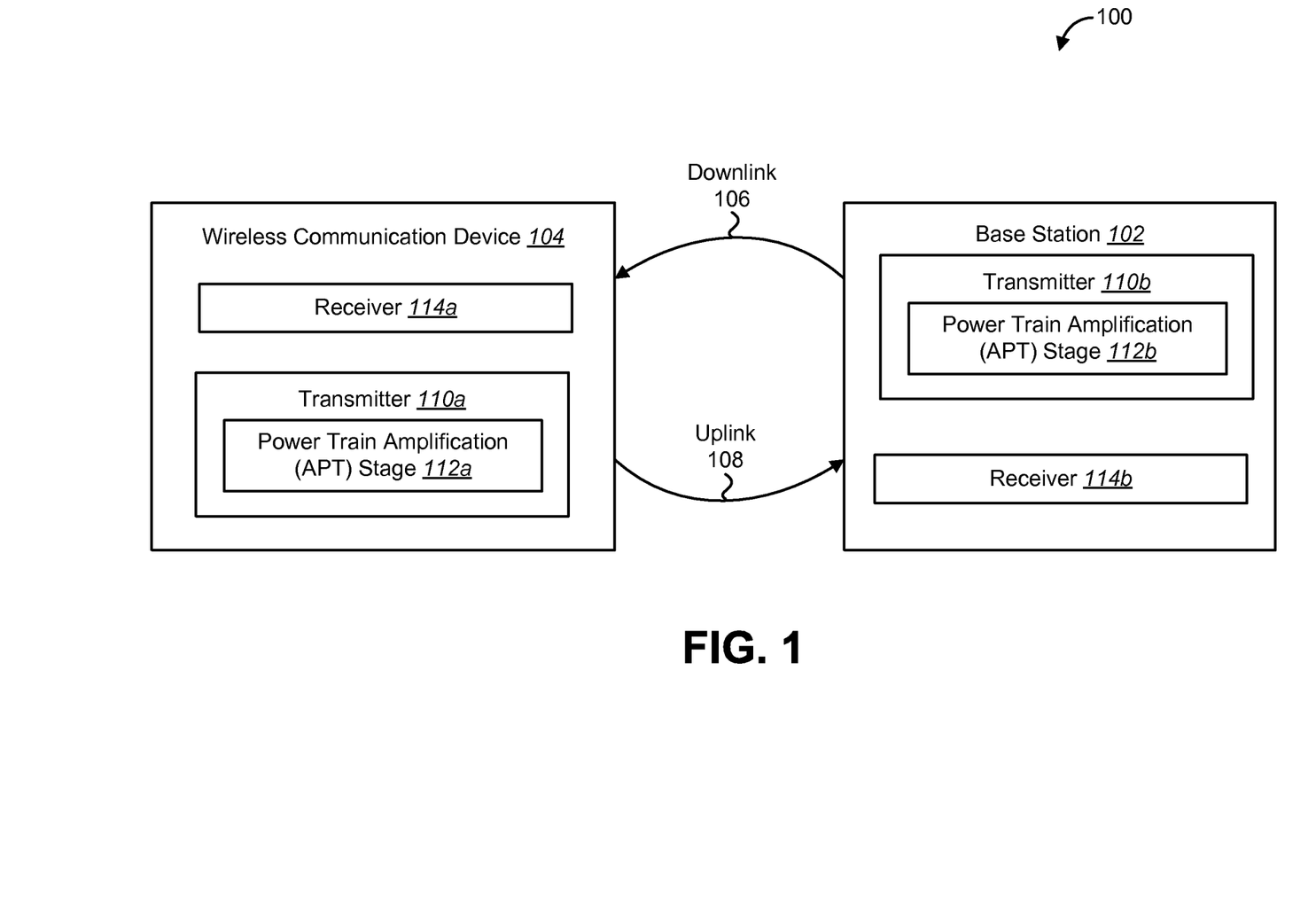
FIG. 1 shows a wireless communication system with multiple wireless devices.

FIG. 1 shows a wireless communication system 100 with multiple wireless devices. Wireless communication systems 100 are widely deployed to provide various types of communication content such as voice, data and so on. A wireless device may be a base station 102 or a wireless communication device 104.

A base station 102 is a station that communicates with one or more wireless communication devices 104. A base station 102 may also be referred to as, and may include some or all of the functionality of, an access point, a broadcast transmitter, a NodeB, an evolved NodeB, etc. The term "base station" will be used herein. Each base station 102 provides communication coverage for a particular geographic area. A base station 102 may provide communication coverage for one or more wireless communication devices 104. The term "cell" can refer to a base station 102 and/or its coverage area depending on the context in which the term is used.

A wireless communication device 104 may also be referred to as, and may include some or all of the functionality of, a terminal, an access terminal, a user equipment (UE), a subscriber unit, a station, etc. A wireless communication device 104 may be a cellular phone, a personal digital assistant (PDA), a wireless device, a wireless modem, a handheld device, a laptop computer, a tablet computer, a PC card, compact flash, an external or internal modem, a wireline phone, etc. A wireless communication device 104 may be mobile or stationary. A wireless communication device 104 may communicate with zero, one or multiple base stations 102 on a downlink 106 and/or an uplink 108 at any given moment. The downlink 106 (or forward link) refers to the communication link from a base station 102 to a wireless communication device 104, and the uplink 108 (or reverse link) refers to the communication link from a wireless communication device 104 to a base station 102. Uplink 108 and downlink 106 may refer to the communication link or to the carriers used for the communication link.

Communications in a wireless communication system 100 (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system 100 may utilize both single-input and multiple-output (SIMO) and multiple-input and multiple-output (MIMO). The wireless communication system 100 may be a multiple-access system capable of supporting communication with multiple wireless communication devices 104 by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

A wireless device may include a transmitter 110a-b and a receiver 114a-b. In one configuration, the transmitter 110 and the receiver 114 may be collectively referred to as a transceiver. A transmitter 110 may include a power train amplification (APT) stage 112a-b. The power train amplification (APT) stage 112 may amplify signals prior to transmission. A power train amplification (APT) stage 112 may be included in a transmitter 110a on the wireless communication device 104 and a transmitter 110b on the base station 102. The power train amplification (APT) stage 112 may use a Dynamic Voltage Scaling (DVS) scheme to conserve power and increase performance In one configuration, an open loop calibration of Dynamic Voltage Scaling (DVS) schemes may be used. However, due to a conservative estimate of the voltage profile across power, an open loop calibration of Dynamic Voltage Scaling (DVS) schemes may have inefficiencies. For example, the voltage profile may be conservative to account for part-to-part and frequency/temperature variations. Feedback based Dynamic Voltage Scaling (DVS) schemes may be used in mission mode to impart a more aggressive voltage profile to increase efficiency. An open loop power train amplification (APT) stage 112 may have an inefficient frequency change versus the output of a power amplifier (PA) Pout. An open loop power train amplification (APT) stage 112 may also have an inefficient temperature change versus the output of the power amplifier (PA) Pout. Furthermore, an open loop power train amplification (APT) stage 112 may have a conservative collector bias versus the adjacent channel leakage ratio (ACLR). An open loop power train amplification (APT) stage 112 may have calibration inefficiencies. A closed loop power train amplification (APT) stage 112 may address all of these inefficiencies.

Figure 2:
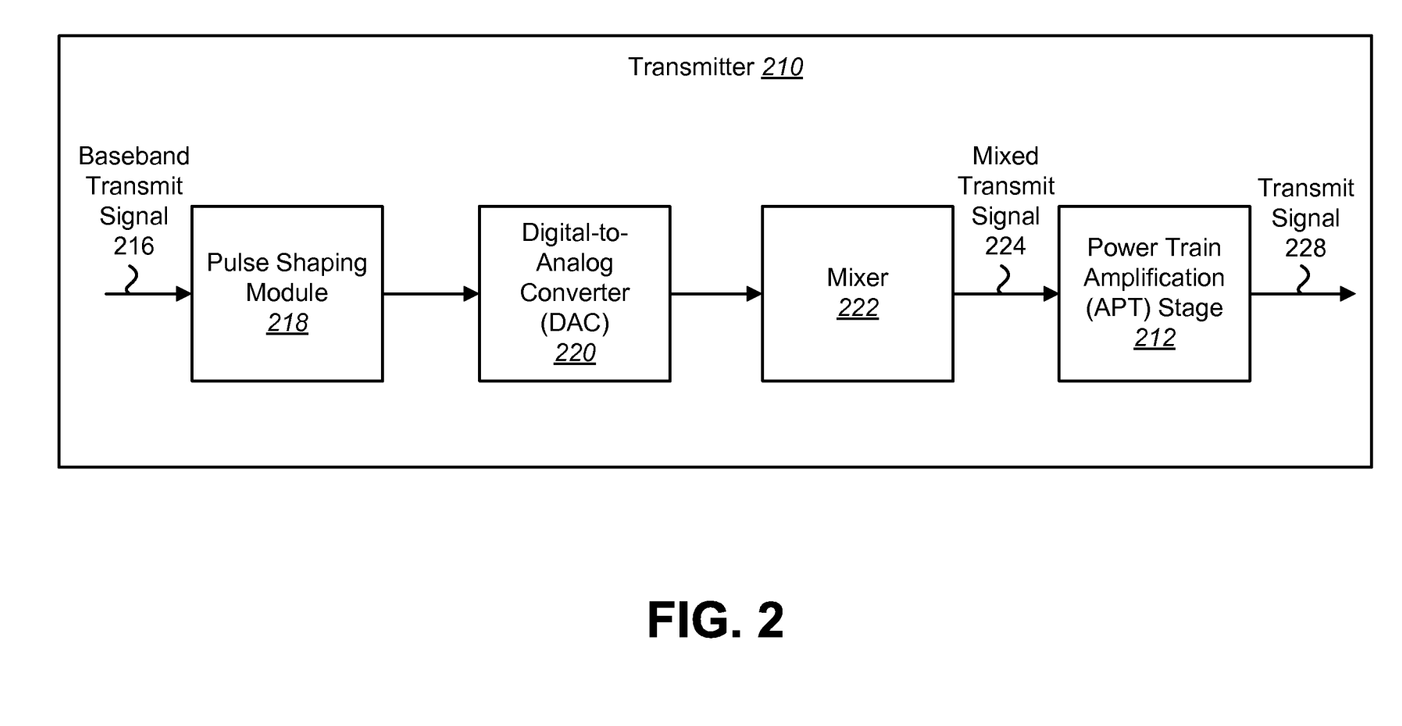
FIG. 2 is a block diagram illustrating a transmitter for use in the present systems and methods.

FIG. 2 is a block diagram illustrating a transmitter 210 for use in the present systems and methods. The transmitter 210 of FIG. 2 may be one configuration of the transmitters 110a-b of FIG. 1. The transmitter 210 may include a pulse shaping module 218. The pulse shaping module 218 may receive a baseband transmit signal 216. The pulse shaping module 218 may be coupled to a digital-to-analog converter (DAC) 220. The digital-to-analog converter (DAC) 220 may be coupled to a mixer 222. The mixer 222 may output a mixed transmit signal 228 to a power train amplification (APT) stage 212. The power train amplification (APT) stage 212 of FIG. 2 may be one configuration of the power train amplification (APT) stages 112a-b of FIG. 1. The power train amplification (APT) stage 212 may output a transmit signal 228. In one configuration, the power train amplification (APT) stage 212 may output the transmit signal 228 to a duplexer.

Figure 3:
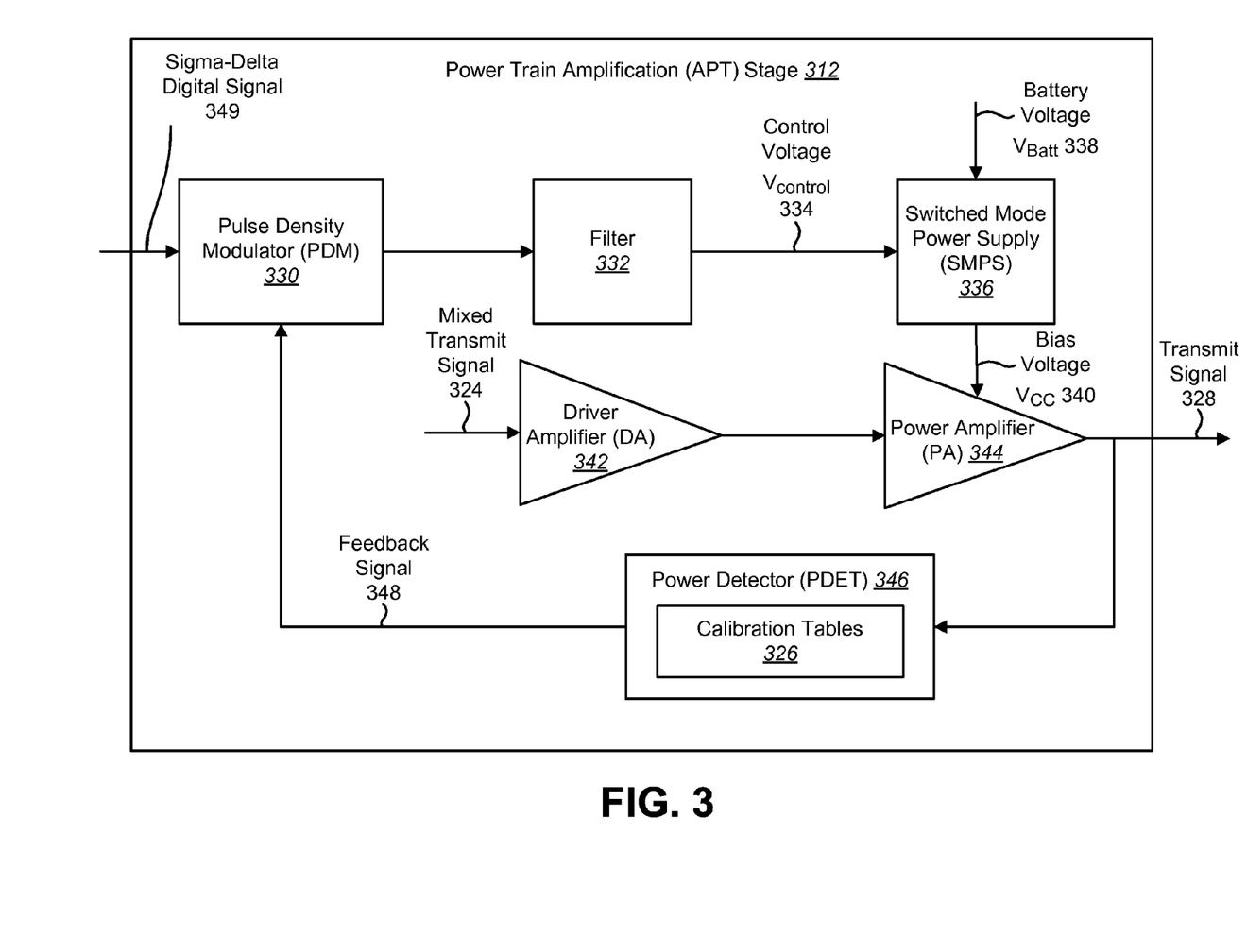
FIG. 3 is a block diagram illustrating a power train amplification (APT) stage for use in the present systems and methods.

FIG. 3 is a block diagram illustrating a power train amplification (APT) stage 312 for use in the present systems and methods. The power train amplification (APT) stage 312 of FIG. 3 may be one configuration of the power train amplification (APT) stages 112a-b of FIG. 1. The power train amplification (APT) stage 312 may use a closed loop feedback path that includes a power detector (PDET) 346.

Figure 8:
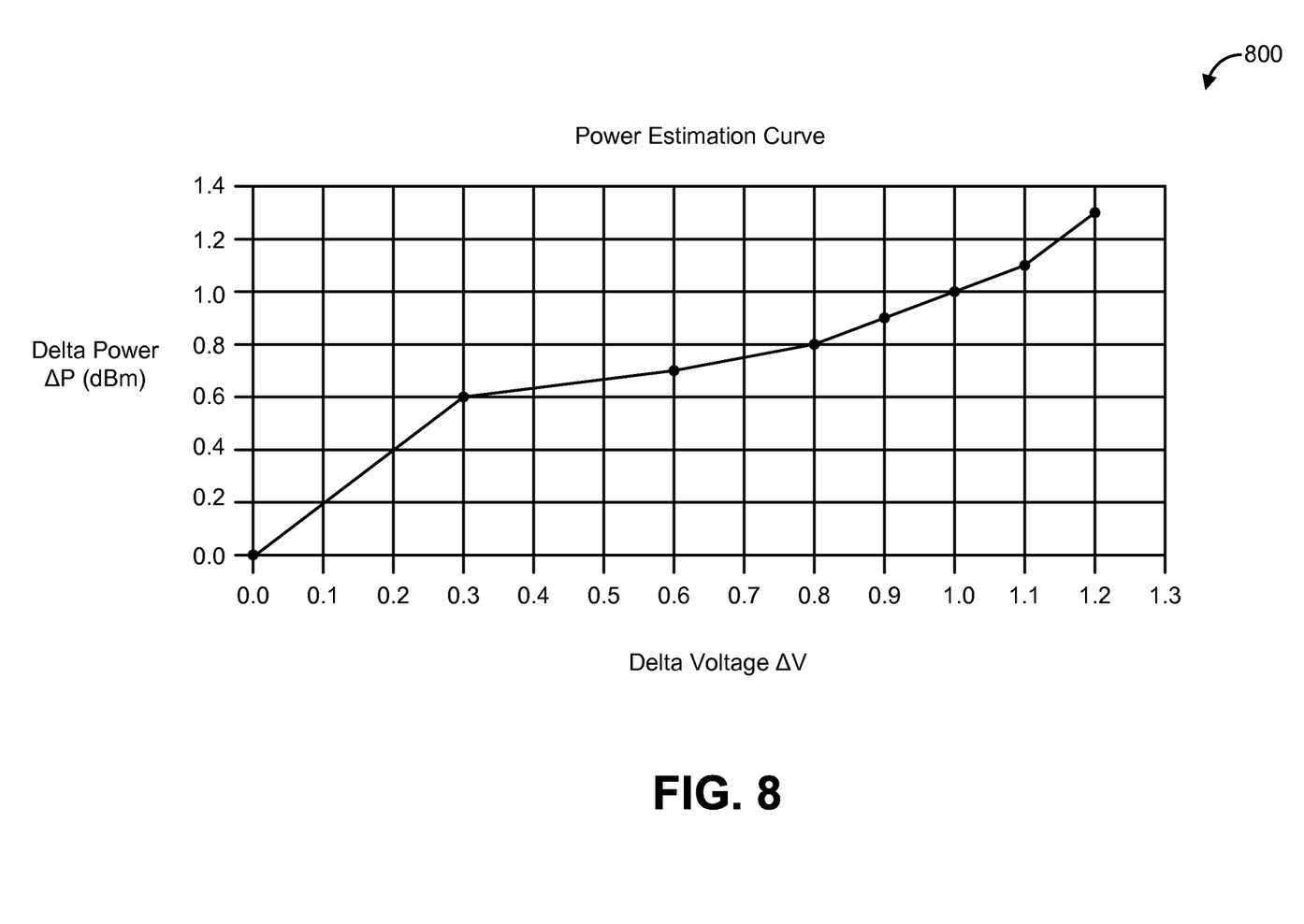
FIG. 8 is a graph illustrating a power estimation curve as a function of bias voltage Vcc.

The power train amplification (APT) stage 312 may include a pulse density modulator (PDM) 330. The pulse density modulator (PDM) 330 may receive a sigma-delta digital signal 349 from a modem. The output of the pulse density modulator (PDM) 330 may be coupled to a filter 332. In one configuration, the filter 332 may be a RC-RC filter. The filter 332 may output a control voltage Vcontrol 334 to a switched mode power supply (SMPS) 336. The switched mode power supply (SMPS) 336 may also receive a battery voltage VBatt 338. The switched mode power supply (SMPS) 336 may output a bias voltage Vcc 340 to a power amplifier (PA) 344. The bias voltage Vcc 340 may control the power output of the power amplifier (PA) 344. A power estimate for the power amplifier (PA) 344 may be obtained from a ΔP (change in power) versus ΔV (change in voltage) curve. One example of a power estimate curve is illustrated in FIG. 8.

The input to the power amplifier (PA) 344 may be coupled to the output of a driver amplifier (DA) 342. The driver amplifier (DA) 342 may receive a mixed transmit signal 324 from a mixer 222. The power amplifier (PA) 344 may output a transmit signal 328. The transmit signal 328 may be passed through a power detector (PDET) 346 to obtain a feedback signal 348. The power detector (PDET) 346 may be a very accurate power measurement device. The power detector (PDET) 346 may need to have reference Pout calibration performed. The power detector (PDET) 346 may also require continuous monitoring in online mode to keep updating the bias for the power amplifier (PA) 344. The power detector (PDET) 346 may update calibration tables 326 appropriately. The power detector (PDET) 346 may output a feedback signal 348 to the pulse density modulator (PDM) 330.

The power detector (PDET) 346 may be in continuous use. In one configuration, the power detector (PDET) 346 may be used for the 7-8 decibels (dB) of the power amplifier (PA) 344 range. The battery life impact may then have less of an impact at the top of the 7-8 dB range. The use of the power detector (PDET) 346 may result in no estimation of the adjacent channel leakage ratio (ACLR) and no pre-distortion. An automatic gain control (AGC) (not shown) may control the driver amplifier (DA) 342, the power amplifier (PA) 344 and other blocks in the transmit (Tx) chain.

Figure 4:
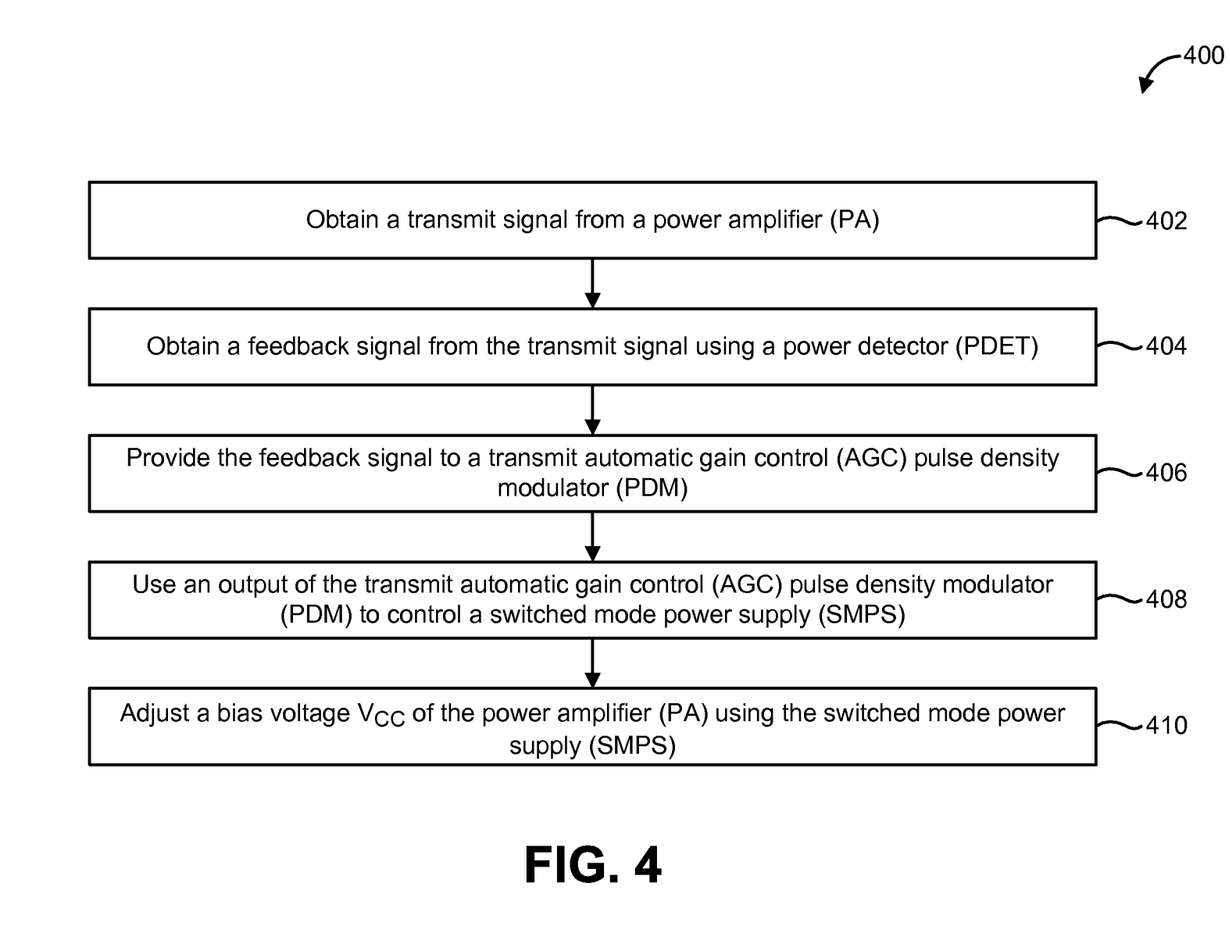
FIG. 4 is a flow diagram of a method for adjusting a bias voltage Vcc to a power amplifier (PA) using a feedback path through a power detector (PDET)

FIG. 4 is a flow diagram of a method 400 for adjusting a bias voltage Vcc 340 to a power amplifier (PA) 344 using a feedback path through a power detector (PDET) 346. The method 400 may be performed by a wireless device. The wireless device may be a base station 102 or a wireless communication device 104. In one configuration, the method 400 may be performed by a transmitter 110 on the wireless device.

The wireless device may obtain 402 a transmit signal 328 from a power amplifier (PA) 344. The wireless device may obtain 404 a feedback signal 348 from the transmit signal 328 using a power detector (PDET) 346. The wireless device may provide 406 the feedback signal 348 to a pulse density modulator (PDM) 330. The wireless device may use 408 an output of the pulse density modulator (PDM) 330 to control a switched mode power supply (SMPS) 336. The wireless device may adjust 410 a bias voltage Vcc 340 of the power amplifier (PA) 344 using the switched mode power supply (SMPS) 336. The bias voltage Vcc 340 may be adjusted to remove the power train amplification (APT) slack over frequency and temperature without the need for extra calibration. By adjusting the bias voltage Vcc 340, the battery current consumption by the wireless device may be reduced.

Figure 5:
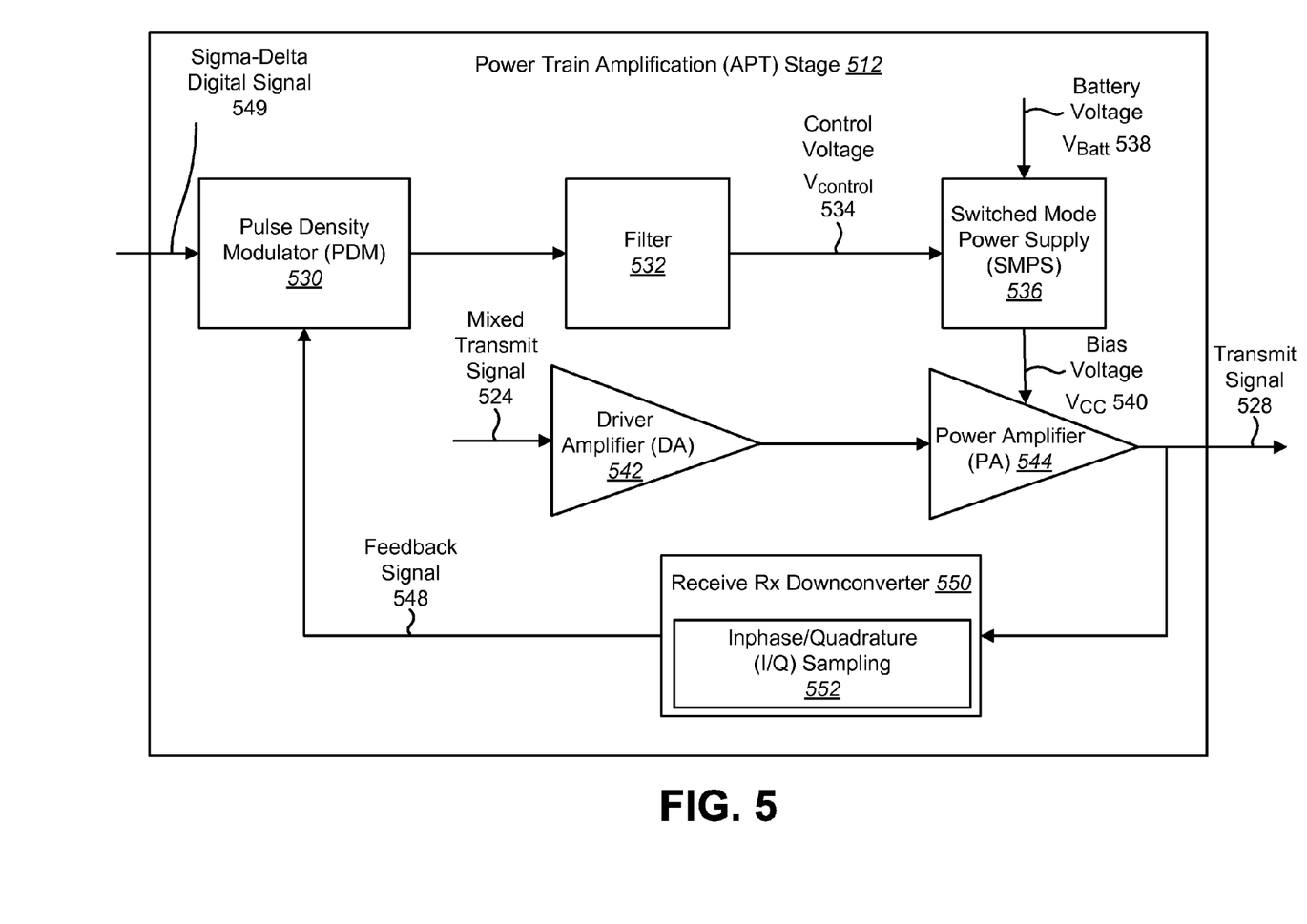
FIG. 5 is a block diagram illustrating another power train amplification (APT) stage for use in the present systems and methods.

FIG. 5 is a block diagram illustrating another power train amplification (APT) stage 512 for use in the present systems and methods. The power train amplification (APT) stage 512 of FIG. 5 may be one configuration of the power train amplification (APT) stages 112a-b of FIG. 1. The power train amplification (APT) stage 512 may use a closed loop feedback path that includes a receive Rx downconverter 550.

The power train amplification (APT) stage 512 may include a pulse density modulator (PDM) 530. The pulse density modulator (PDM) 530 may receive a sigma-delta digital signal 549 from a modem. The output of the pulse density modulator (PDM) 530 may be coupled to a filter 532. In one configuration, the filter 532 may be an RC-RC filter. The filter 532 may output a control voltage Vcontrol 534 to a switched mode power supply (SMPS) 536. The switched mode power supply (SMPS) 536 may also receive a battery voltage VBatt 538. The switched mode power supply (SMPS) 536 may output a bias voltage Vcc 540 to a power amplifier (PA) 544. The bias voltage Vcc 540 may control the power output versus voltage output for the power amplifier (PA) 544. As discussed above, a power estimate for the power amplifier (PA) 544 may be obtained from a power estimate curve that plots ΔP (change in power) versus ΔV (change in voltage). One example of a power estimate curve is illustrated in FIG. 8.

The input to the power amplifier (PA) 544 may be coupled to the output of a driver amplifier (DA) 542. The driver amplifier (DA) 542 may receive a mixed transmit signal 524 from a mixer 222. The power amplifier (PA) 544 may output a transmit signal 528. The transmit signal 528 may be passed through a receive Rx downconverter 550. The receive Rx downconverter 550 may include inphase/quadrature (I/Q) sampling 552. The receive Rx downconverter 550 may be a normal receiver chain with looser requirements in terms of noise and linearity. The receive Rx downconverter 550 may include a standard amplifier stage (e.g., a low noise amplifier (LNA)), a mixer (in one configuration the phase lock loop (PLL) and local oscillator (LO) may be shared with the transmitter), an analog baseband filter and an analog-to-digital converter (ADC). The analog-to-digital converter (ADC) may be stand-alone or shred with an analog-to-digital converter (ADC) in the main receiver path and be time multiplexed with the shred analog-to-digital converter (ADC). The receive Rx downconverter 550 may output a feedback signal 548 to the pulse density modulator (PDM) 530. In one configuration, the output of the analog-to-digital converter (ADC) may control the pulse density modulator (PDM) 530 value.

Figure 6:
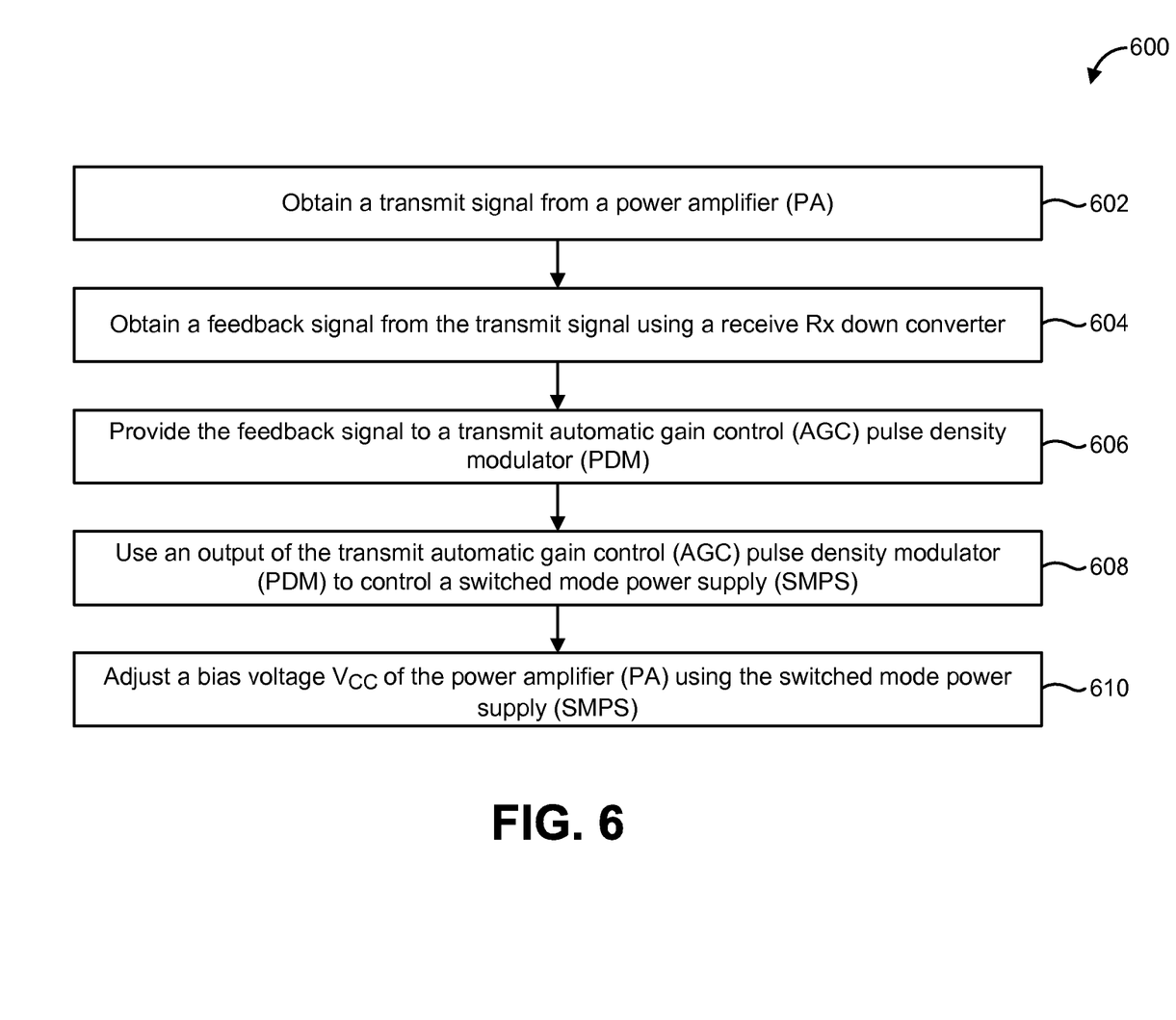
FIG. 6 is a flow diagram of a method for adjusting a bias voltage Vcc to a power amplifier (PA) using a feedback path through a receive Rx downconverter.

FIG. 6 is a flow diagram of a method 600 for adjusting a bias voltage Vcc 540 to a power amplifier (PA) 544 using a feedback path through a receive Rx downconverter 550. The method 600 may be performed by a wireless device. The wireless device may be a base station 102 or a wireless communication device 104. In one configuration, the method 600 may be performed by a transmitter 110 on the wireless device.

The wireless device may obtain 602 a transmit signal 528 from a power amplifier (PA) 544. The wireless device may obtain 604 a feedback signal 548 from the transmit signal 528 using a receive Rx downconverter 550. The wireless device may provide 606 the feedback signal 548 to a pulse density modulator (PDM) 530. The wireless device may use 608 an output of a pulse density modulator (PDM) 530 to control a switched mode power supply (SMPS) 536. The wireless device may adjust 610 a bias voltage Vcc 540 of the power amplifier (PA) 544 using the switched mode power supply (SMPS) 536. The bias voltage Vcc 540 may be adjusted to remove the power train amplification (APT) slack over frequency and temperature without the need for extra calibration. By adjusting the bias voltage Vcc 540, the battery current consumption by the wireless device may be reduced.

Figure 7:
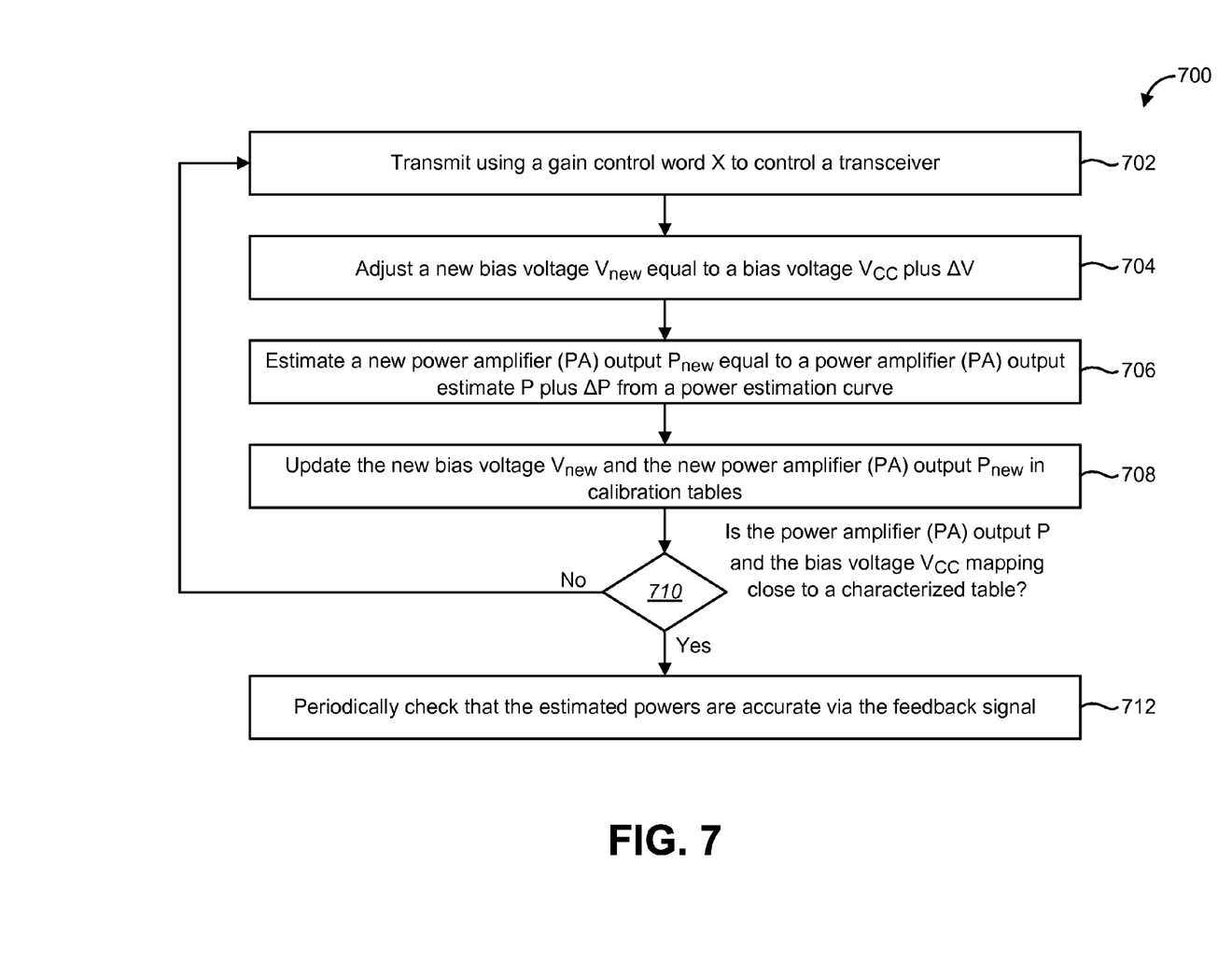
FIG. 7 is a flow diagram of a method for updating calibration tables used to adjust the bias voltage Vcc to a power amplifier (PA)

FIG. 7 is a flow diagram of a method 700 for updating calibration tables 326 used to adjust the bias voltage Vcc 340 to a power amplifier (PA) 344. The method 700 may be performed by a wireless device. In one configuration, the wireless device may be a base station 102 or a wireless communication device 104. It may be assumed that a characterized power amplifier (PA) 344 versus bias voltage Vcc 340 profile such as that in Table 1 below is used.

TABLE 1

| Switched Mode Power Supply (SMPS) Characterization Table | |
|---|---|
| Power Amplifier (PA) Output Power (dBm) | Switched Mode Power Supply (SMPS) Output (V) (Bias Voltage Vcc) |
| 16 | 2.2 |
| 17 | 2.3 |
| 18 | 2.4 |
| 19 | 2.5 |

TABLE 1-continued

| Switched Mode Power Supply (SMPS) Characterization Table | |
|---|---|
| Power Amplifier (PA) Output Power (dBm) | Switched Mode Power Supply (SMPS) Output (V) (Bias Voltage Vcc) |
| 20 | 2.6 |
| 21 | 2.8 |
| 22 | 3.1 |
| 23 | 3.4 |
| 24 | 3.4 |
| 25 | 3.4 |
| 26 | 3.4 |

The wireless device may transmit 702 using a gain control word X. The gain control word X may control a transceiver at this particular instant. For the gain word X, the power amplifier (PA) 344 output may be P (in dBm (the power ratio in dB of the measured power reference to 1 milliwatt (mW))) and the switched mode power supply (SMPS) 336 output (i.e., the bias voltage Vcc 340) may be in volts. The wireless device may adjust 704 a new bias voltage Vnew equal to the bias voltage Vcc 340 plus ΔV (where ΔV is an incremental change in voltage). The wireless device may estimate 706 a new power amplifier (PA) 344 output Pnew equal to a power amplifier (PA) 344 output P plus ΔP (where ΔP is an incremental change in power in dBm) from a power estimation curve (such as that of FIG. 8). The wireless device may then update 708 the new bias voltage Vnew and the new power amplifier (PA) 344 output Pnew in calibration tables 326 on the wireless device. The wireless device may ensure that the calibration tables 326 are always monotonic and have a certain minimum step size with the adjacent pulse density modulator (PDM) 330.

The wireless device may determine 710 whether the power amplifier (PA) 344 output P and the bias voltage Vcc 340 mapping is close to a switched mode power supply (SMPS) characterization table (such as that used in Table 1 above). If the power amplifier (PA) 344 output P and the bias voltage Vcc 340 mapping is not close to the characterized table, the wireless device may transmit 702 using a gain control word X to control the transceiver. The power units and the switched mode power supply (SMPS) pulse density modulator (PDM) units may be discrete digital quantities. If the power amplifier (PA) 344 output P and the bias voltage Vcc 340 mapping is close to the characterized table, the wireless device may periodically check 712 that the estimated power are accurate via the feedback signal 348. Until an exact match is found, the tables may continue to be updated.

To calibrate the power train amplification (APT) stage 112, two power sweeps may be performed. A first power sweep may be performed at a fixed bias. The first power sweep may establish Pout to RGI mapping. A second power sweep may be performed with the power train amplification (APT) voltages (i.e., using a variable bias voltage Vcc 340). The second power sweep may establish RGI to switched mode power supply (SMPS) 336 to Pout mapping.

FIG. 8 is a graph illustrating a power estimation curve 800 as a function of bias voltage Vcc 540. The power estimation curve 800 may be obtained from a Dynamic Voltage Scaling (DVS) calibration scheme. Other power estimation curves may also be used. The power estimation curve illustrates the change in delta voltage ΔV (i.e., the change in the bias voltage Vcc 840) and the corresponding change in delta power ΔP output by the power amplifier (PA) 344.

Figure 9:
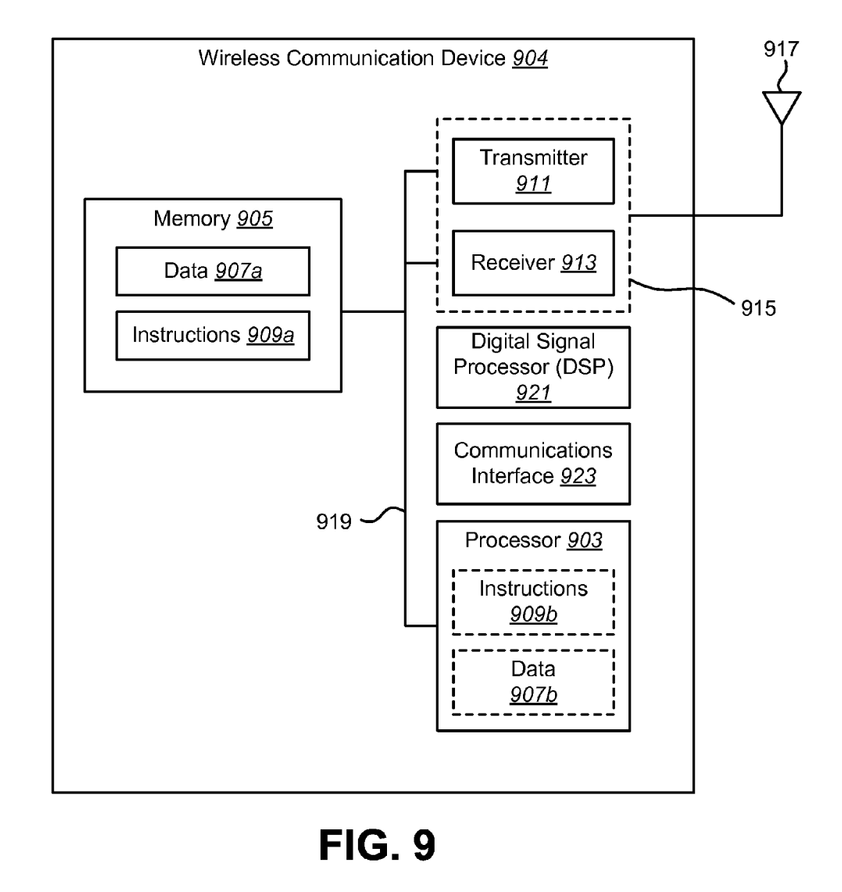
FIG. 9 illustrates certain components that may be included within a wireless communication device.

FIG. 9 illustrates certain components that may be included within a wireless communication device 904. The wireless communication device 904 may be an access terminal, a mobile station, a user equipment (UE), etc. The wireless communication device 904 includes a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the wireless communication device 904 of FIG. 9, in an alternative configuration, a combination of processors (e.g., an ARM and DSP) could be used.

The wireless communication device 904 also includes memory 905. The memory 905 may be any electronic component capable of storing electronic information. The memory 905 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof Data 907*a* and instructions 909*a* may be stored in the memory 905. The instructions 909*a* may be executable by the processor 903 to implement the methods disclosed herein. Executing the instructions 909*a* may involve the use of the data 907*a* that is stored in the memory 905. When the processor 903 executes the instructions 909, various portions of the instructions 909*b* may be loaded onto the processor 903, and various pieces of data 907*b* may be loaded onto the processor 903.

The wireless communication device 904 may also include a transmitter 911 and a receiver 913 to allow transmission and reception of signals to and from the wireless communication device 904 via an antenna 917. The transmitter 911 and receiver 913 may be collectively referred to as a transceiver 915. The wireless communication device 904 may also include (not shown) multiple transmitters, multiple antennas, multiple receivers and/or multiple transceivers.

The wireless communication device 904 may include a digital signal processor (DSP) 921. The wireless communication device 904 may also include a communications interface 923. The communications interface 923 may allow a user to interact with the wireless communication device 904.

The various components of the wireless communication device 904 may be coupled together by one or more buses, which may include a power bus, a control signal bus, a status signal bus, a data bus, etc. For the sake of clarity, the various buses are illustrated in FIG. 9 as a bus system 919.

Figure 10:
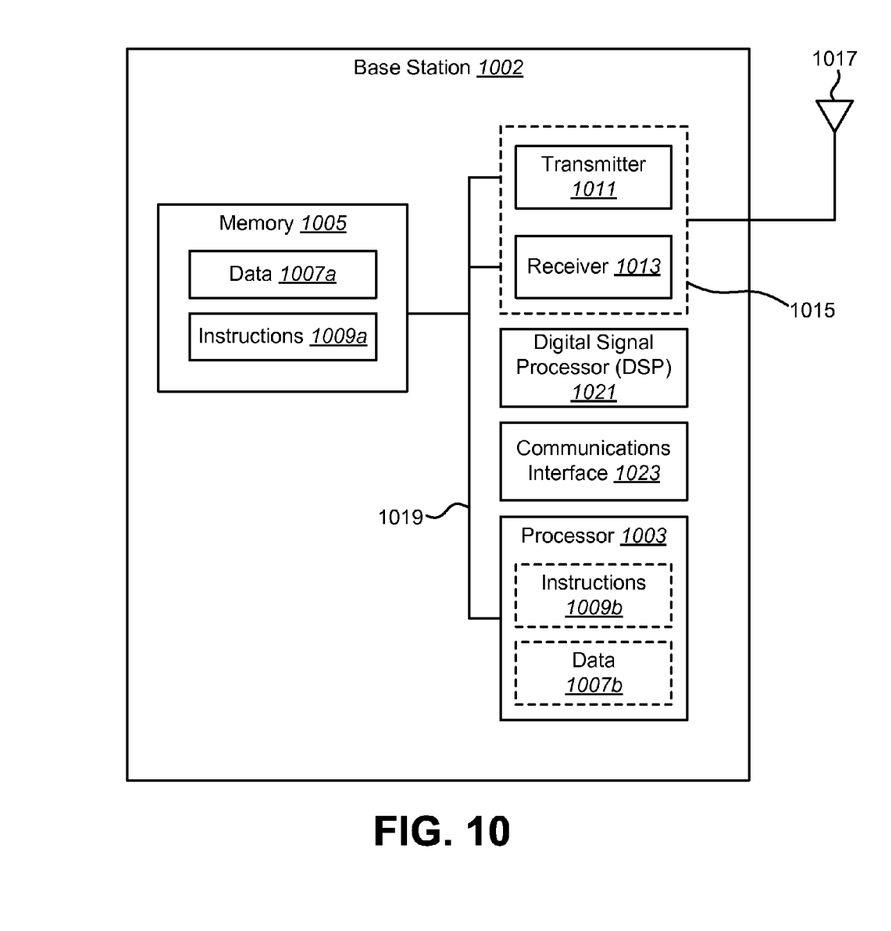
FIG. 10 illustrates certain components that may be included within a base station.

FIG. 10 illustrates certain components that may be included within a base station 1002. A base station 1002 may also be referred to as, and may include some or all of the functionality of, an access point, a broadcast transmitter, a NodeB, an evolved NodeB, etc. The base station 1002 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the base station 1002 of FIG. 10, in an alternative configuration, a combination of processors (e.g., an ARM and DSP) could be used.

The base station 1002 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof.

Data 1007*a* and instructions 1009*a* may be stored in the memory 1005. The instructions 1009*a* may be executable by the processor 1003 to implement the methods disclosed herein. Executing the instructions 1009*a* may involve the use of the data 1007*a* that is stored in the memory 1005. When the processor 1003 executes the instructions 1009*a*, various portions of the instructions 1009*b* may be loaded onto the processor 1003, and various pieces of data 1007*b* may be loaded onto the processor 1003.

The base station 1002 may also include a transmitter 1011 and a receiver 1013 to allow transmission and reception of signals to and from the base station 1002. The transmitter 1011 and receiver 1013 may be collectively referred to as a transceiver 1015. An antenna 1017 may be electrically coupled to the transceiver 1015. The base station 1002 may also include (not shown) multiple transmitters, multiple receivers, multiple transceivers and/or additional antennas.

The base station 1002 may include a digital signal processor (DSP) 1021. The base station 1002 may also include a communications interface 1023. The communications interface 1023 may allow a user to interact with the base station 1002.

The various components of the base station 1002 may be coupled together by one or more buses, which may include a power bus, a control signal bus, a status signal bus, a data bus, etc. For the sake of clarity, the various buses are illustrated in FIG. 10 as a bus system 1019.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4, 6 and 7, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A power train amplification stage, comprising:
    a power amplifier;
    a switched mode power supply that provides a bias voltage to the power amplifier;
    a pulse density modulator; and
    a feedback path from the power amplifier to the pulse density modulator, wherein the feedback path comprises a receive downconverter.

2. The power train amplification stage of claim 1, wherein the pulse density modulator controls the switched mode power supply.

3. The power train amplification stage of claim 1, wherein the pulse density modulator receives a sigma-delta digital signal.

4. The power train amplification stage of claim 1, wherein the power train amplification stage uses dynamic voltage scaling to reduce inefficiencies in the power amplifier.

5. The power train amplification stage of claim 4, wherein the inefficiencies comprise at least one of a frequency change versus power amplifier output, a temperature change versus power amplifier output, a conservative collector bias versus adjacent channel leakage ratio inefficiencies, or calibration inefficiencies.

6. The power train amplification stage of claim 1, wherein the receive downconverter comprises inphase/quadrature sampling.

7. The power train amplification stage of claim 1, wherein the power train amplification stage is part of a transmitter in a wireless communication device.

8. The power train amplification stage of claim 1, wherein the power train amplification stage is part of a transmitter in a base station.

9. A method for adjusting a bias voltage to a power amplifier, the method comprising:
    obtaining a transmit signal from a power amplifier;
    obtaining a feedback signal from the transmit signal, wherein the feedback signal is obtained using a receive downconverter;
    providing the feedback signal to a pulse density modulator;
    using an output of the pulse density modulator to control a switched mode power supply; and
    adjusting a bias voltage applied to the power amplifier using the switched mode power supply.

10. The method of claim 9, wherein the method is performed by a wireless communication device.

11. The method of claim 9, wherein the method is performed by a base station.

12. A method for adjusting a bias voltage to a power amplifier, the method comprising:
    obtaining a transmit signal from a power amplifier;
    obtaining a feedback signal from the transmit signal, wherein the feedback signal is obtained using a power detector, the power detector maintaining calibration tables for the power amplifier;
    providing the feedback signal to a pulse density modulator;
    using an output of the pulse density modulator to control a switched mode power supply; and
    adjusting a bias voltage applied to the power amplifier using the switched mode power supply, wherein maintaining calibration tables for the power amplifier comprises:
transmitting using a gain control word to control a transceiver;
incrementally adjusting the bias voltage to obtain a new bias voltage;
estimating a new power amplifier output using a power estimation curve; and
updating the new bias voltage and the new power amplifier output in the calibration tables.

13. The method of claim 12, further comprising:
determining that a mapping of the new power amplifier output and the new bias voltage is close to a characterized table; and
periodically checking that the new power amplifier output is accurate via the feedback signal.

14. The method of claim 9, wherein the receive downconverter comprises inphase/quadrature sampling.

15. The method of claim 9, wherein the method reduces inefficiencies in the power amplifier using dynamic voltage scaling.

16. The method of claim 15, wherein the inefficiencies comprise at least one of a frequency change versus power amplifier output, a temperature change versus power amplifier output, a conservative collector bias versus adjacent channel leakage ratio inefficiencies, or calibration inefficiencies.

17. An apparatus for adjusting a bias voltage to a power amplifier, comprising:
means for obtaining a transmit signal from a power amplifier;
means for obtaining a feedback signal from the transmit signal, wherein the feedback signal is obtained using a receive downconverter;
means for providing the feedback signal to a pulse density modulator;
means for using an output of the pulse density modulator to control a switched mode power supply; and
means for adjusting a bias voltage applied to the power amplifier using the switched mode power supply.

18. The apparatus of claim 17, wherein the receive downconverter comprises inphase/quadrature sampling.

19. A computer-program product for adjusting a bias voltage to a power amplifier, the computer-program product comprising a non-transitory computer-readable medium having instructions thereon, the instructions comprising:
code for causing a wireless device to obtain a transmit signal from a power amplifier;
code for causing the wireless device to obtain a feedback signal from the transmit signal, wherein the feedback signal is obtained using a receive downconverter;
code for causing the wireless device to provide the feedback signal to a pulse density modulator;
code for causing the wireless device to use an output of the pulse density modulator to control a switched mode power supply; and
code for causing the wireless device to adjust a bias voltage applied to the power amplifier using the switched mode power supply.

20. The computer-program product of claim 19, wherein the receive downconverter comprises inphase/quadrature sampling.

* * * * *